United States Patent
Maspero et al.

(10) Patent No.: US 10,315,916 B2
(45) Date of Patent: Jun. 11, 2019

(54) MICROELECTROMECHANICAL DEVICE WITH AT LEAST ONE TRANSLATIONALLY GUIDED MOVEABLE ELEMENT

(71) Applicant: COMMISSARIAT A L'ENERGIE ATOMIQUE ET AUX ENERGIES ALTERNATIVES, Paris (FR)

(72) Inventors: Federico Maspero, Cantu (IT); Loic Joet, Claix (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/008,578

(22) Filed: Jun. 14, 2018

(65) Prior Publication Data

US 2018/0362333 A1    Dec. 20, 2018

(30) Foreign Application Priority Data

Jun. 16, 2017 (FR) .................................. 17 55480

(51) Int. Cl.
*H01L 29/84* (2006.01)
*B81B 7/02* (2006.01)
(Continued)

(52) U.S. Cl.
CPC ............ *B81B 7/02* (2013.01); *B81B 3/0051* (2013.01); *B81B 3/0062* (2013.01); *B81B 5/00* (2013.01);
(Continued)

(58) Field of Classification Search
CPC ....... B81B 7/02; B81B 3/0051; B81B 3/0062; B81B 5/00; B81B 3/0018;
(Continued)

(56) References Cited

U.S. PATENT DOCUMENTS 6,384,952 B1    5/2002    Clark et al.
8,729,770 B1    5/2014    Milanovic
(Continued)

FOREIGN PATENT DOCUMENTS

| DE | 10 2012 223 016 A1 | 6/2014 |
| EP | 2 599 746 A1 | 6/2013 |
| WO | WO 2006/110304 A1 | 10/2006 |
| WO | WO 2010/038229 A2 | 4/2010 |
| WO | WO 2013/108705 A1 | 7/2013 |

OTHER PUBLICATIONS

French Preliminary Search Report dated Feb. 12, 2018 in French Application 17 55480 filed on Jun. 16, 2017 (with English Translation of Categories of Cited Documents).
(Continued)

*Primary Examiner* — Tu-Tu V Ho
(74) *Attorney, Agent, or Firm* — Oblon, McClelland, Maier & Neustadt, L.L.P.

(57) ABSTRACT

Microelectromechanical and/or nanoelectromechanical device comprising a support and at least one moveable element so as to be able to be displaced translationally with respect to the support, a means (G1) for translationally guiding said element, said guiding means (G1) comprising two rigid arms (6), a rotating articulation (12, 10) between each arm (6, 8) and the moveable element (4) and a rotating articulation (10, 14) between each arm (6, 8) and the support, the guiding means (G1) also comprising a coupling articulation (18) between the two arms having at least rotating articulation, said rotating articulations having axes of rotation at least parallel with each other such that during a translational displacement of the moveable element (4) the arms (6, 8) pivot with respect to each other in opposite directions, the rotating articulations being made by torsionally deformable beams.

18 Claims, 14 Drawing Sheets

(51) Int. Cl.
  *B81B 3/00* (2006.01)
  *G01P 15/125* (2006.01)
  *B81B 5/00* (2006.01)
  *G01P 15/08* (2006.01)
(52) U.S. Cl.
  CPC .......... *G01P 15/125* (2013.01); *B81B 3/0018* (2013.01); *B81B 2201/0235* (2013.01); *B81B 2203/04* (2013.01); *G01P 2015/0822* (2013.01)
(58) Field of Classification Search
  CPC ......... B81B 2201/0235; B81B 2203/04; G01P 15/125; G01P 2015/0822
  USPC ....................................................... 257/415
  See application file for complete search history.

(56) References Cited

U.S. PATENT DOCUMENTS

| | | |
|---|---|---|
| 9,708,176 B2* | 7/2017 | Thompson ............ B81B 3/0086 |
| 2003/0210511 A1 | 11/2003 | Sakai et al. |
| 2009/0308160 A1 | 12/2009 | Je et al. |
| 2010/0225255 A1 | 9/2010 | Franke |
| 2016/0138920 A1 | 5/2016 | Kim et al. |

OTHER PUBLICATIONS

U.S. Appl. No. 15/072,495, filed Mar. 17, 2016, US-2016-0277847-A1, Loic Joet.
U.S. Appl. No. 15/625,314, filed Jun. 16, 2017, US-2017-0363424-A1, Federico Maspero, et al.

* cited by examiner

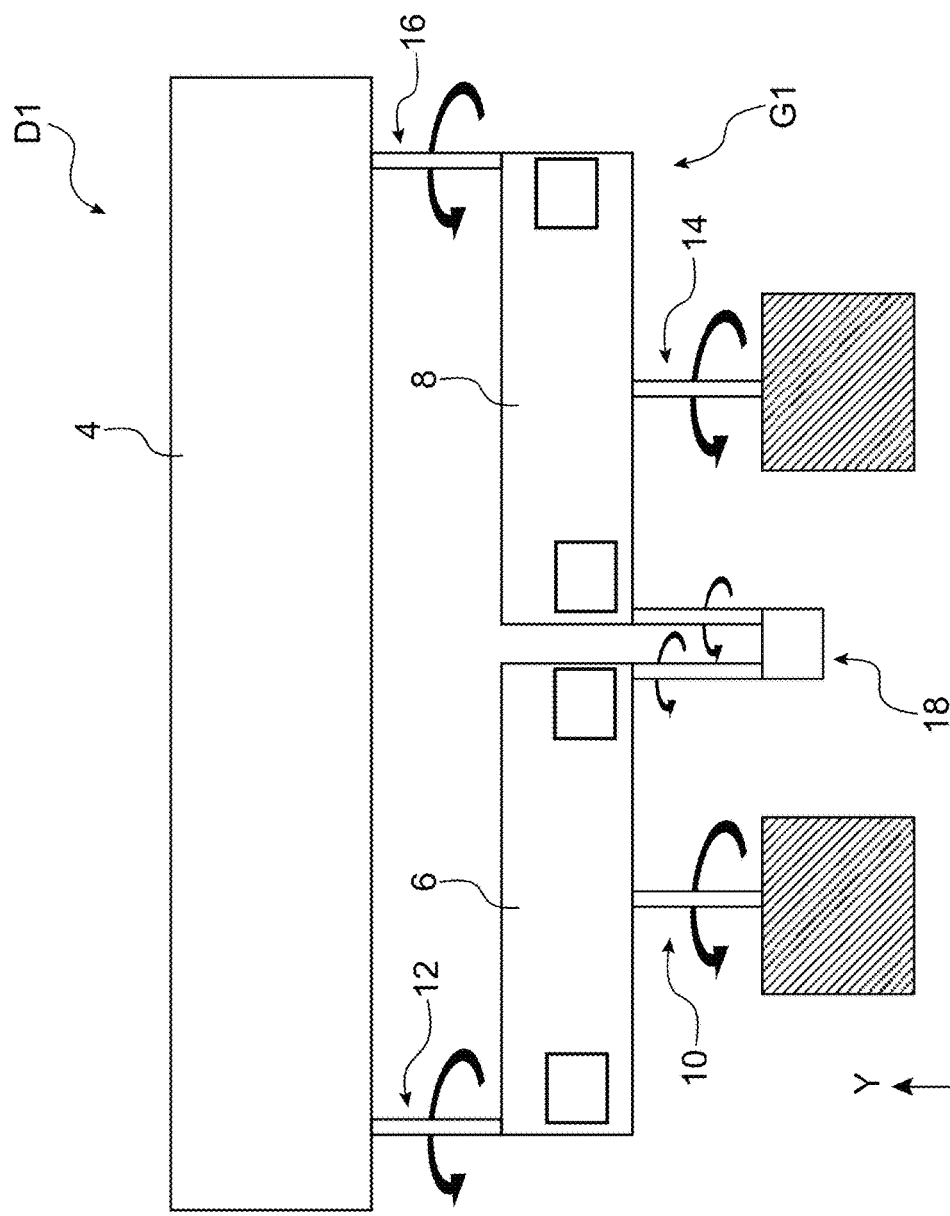

MICROELECTROMECHANICAL DEVICE WITH AT LEAST ONE TRANSLATIONALLY GUIDED MOVEABLE ELEMENT

TECHNICAL FIELD AND PRIOR ART

The present application relates to a microelectromechanical and/or nanoelectromechanical device with at least one translationally guided moveable element.

Microelectromechanical system (MEMS) and nanoelectromechanical system (NEMS) devices are increasingly present in everyday objects such as mobile telephones of smartphone type, tablet computers and smart watches. These devices are used as sensors, for example as inertial sensors and as micro or nanoactuators.

MEMS and/or NEMS devices comprise at least one moveable element forming for example a mass in the case of inertial sensors, such as accelerometers and gyrometers.

For example in the case of accelerometers, the mass is suspended and is intended to be translationally moveable under the effect on an external acceleration. The translational displacement is then measured. The mass may have an out-of-plane displacement and/or a displacement in the plane of the sensor.

The detection of the displacement of the mass may be achieved by different means, for example by capacitive means.

The document US 2009/0308160 describes an accelerometer with out-of-plane displacement with surface variation capacitive detection. In FIG. 12 may be seen a schematic reproduction of the accelerometer of the document US 2009/0308160. It comprises a moveable part 1001 suspended by springs from a fixed part. The moveable part 1001 comprises a mass 1002 fixed to an electrode support part 1004 by an oxide coupling portion 1009. The electrode support part 1004 comprises first moveable electrodes 1005 of a first size and second moveable electrodes 1006 of a second size. The fixed part comprises first fixed electrodes 1007 of a first size and second fixed electrodes 1008 of a second size. The electrodes 1005 and 1007 are interdigitated and the electrodes 1006 and 1008 are interdigitated.

When the accelerometer is subjected to an acceleration perpendicular to the plane of the sensor, the mass is displaced in an out-of-plane direction, the displacement of the mass is detected by the variation in capacitance between the moveable electrodes and the fixed electrodes.

However the mass may have a tilting movement resulting from an acceleration in the plane, this sensitivity to accelerations in the plane is all the greater when the suspension springs are not in the plane of the centre of gravity of the mass.

Yet such a tilting can cause a non-linearity in the measurement of the displacement of the mass, or even place the moveable and fixed electrodes in contact and lead to damage of the sensor.

The document WO 2013/108705 describes a variable capacitance capacitor offering a great amplitude of movement. The capacitor is formed between a fixed part and a moveable part, articulated with respect to the fixed part by arms rotationally articulated on the support and on the moveable part. The moveable plate is not translationally guided so as to limit in a very significant manner, or even prevent, its rotation with respect to the fixed part.

DESCRIPTION OF THE INVENTION

It is consequently an aim of the present disclosure to describe a MEMS and/or NEMS device comprising a translationally moveable element of which the translational guiding is improved.

The aforesaid aim is attained by a MEMS and/or NEMS device comprising at least one moveable element intended to be translationally displaced along a given direction, and means for translationally guiding the element along the given direction, the guiding means comprising at least two rigid arms, each arm being rotationally articulated on the moveable element and the support. Moreover, a coupling articulation comprising at least rotating articulation between the two arms is provided. The arms and the axes of rotation are arranged such that, during a translational displacement of the element, the rotating articulations between the arms and the moveable element are displaced in the same direction and by a same distance, and the coupling articulation between the two arms is activated according to an allowed mode. Conversely, in the case of pivoting of the moveable element, the arms are displaced in opposite directions and the coupling articulation is activated in a forbidden mode. Thus the arms impose a translational movement in said given direction. The moveable element is then translationally guided by the arms and does not undergo accidental pivoting due for example to a force in the plane.

A part at least of the rotating articulations are such that they offer a translational degree of freedom in the plane of the device along the arms.

The coupling element is sufficiently short to offer a rigid coupling between the arms and limit, or even prevent, the rotation of the moveable element with respect to the support and to ensure efficient translational guiding.

According to one example, the coupling articulation is arranged between planes containing the pivot articulations between the arms and the support, said planes being parallel to the out-of-plane direction.

Advantageously, the coupling is achieved by at least one torsion bar.

Very advantageously, a part at least of the rotating articulations comprise torsionally deformable beams.

In one example, one or more guiding means externally line the edge of the moveable element.

In another exemplary embodiment, the guiding means are housed in a window passing through the moveable element.

Advantageously, the device comprises several guiding means. Preferably, the axes of rotation of at least two guiding means are not parallel, they are for example orthogonal.

One subject-matter of the application then is a MEMS and/or NEMS device comprising a support and at least one suspended element so as to be able to be translationally displaced with respect to the support in an out-of-plane direction with respect to a plane of the device, at least one means for translationally guiding said element, said guiding means comprising at least two rigid arms extending longitudinally, a pivot articulation between each arm and the moveable element and a pivot articulation between each arm and the support, the guiding means also comprising a coupling articulation between the two arms comprising at least one pivot articulation, at least two of the pivot articulations connected to each of the arms having a translational degree of freedom in the plane of the device along the arms, said pivot articulations having axes of rotation at least parallel with each other such that during a translational displacement of the moveable element the arms pivot with respect to each other in opposite directions.

Another subject-matter of the application is an inertial sensor comprising at least one MEMS and/or NEMS device of the application, the moveable element forming an inertial mass, and means for detecting the out-of-plane displacement of the inertial mass. For example, the detection means are surface variation capacitive detection means, said means comprising interdigitated electrodes, one part being borne by the inertial mass and the other part being borne by the support situated above the inertial mass.

BRIEF DESCRIPTION OF THE DRAWINGS

The present invention will be better understood on the basis of the description that follows and from the appended drawings, in which:

FIG. 1B represents the device of FIG. 1A, the moveable element being activated in tilting.

DETAILED DESCRIPTION OF PARTICULAR EMBODIMENTS

Figure 1A:
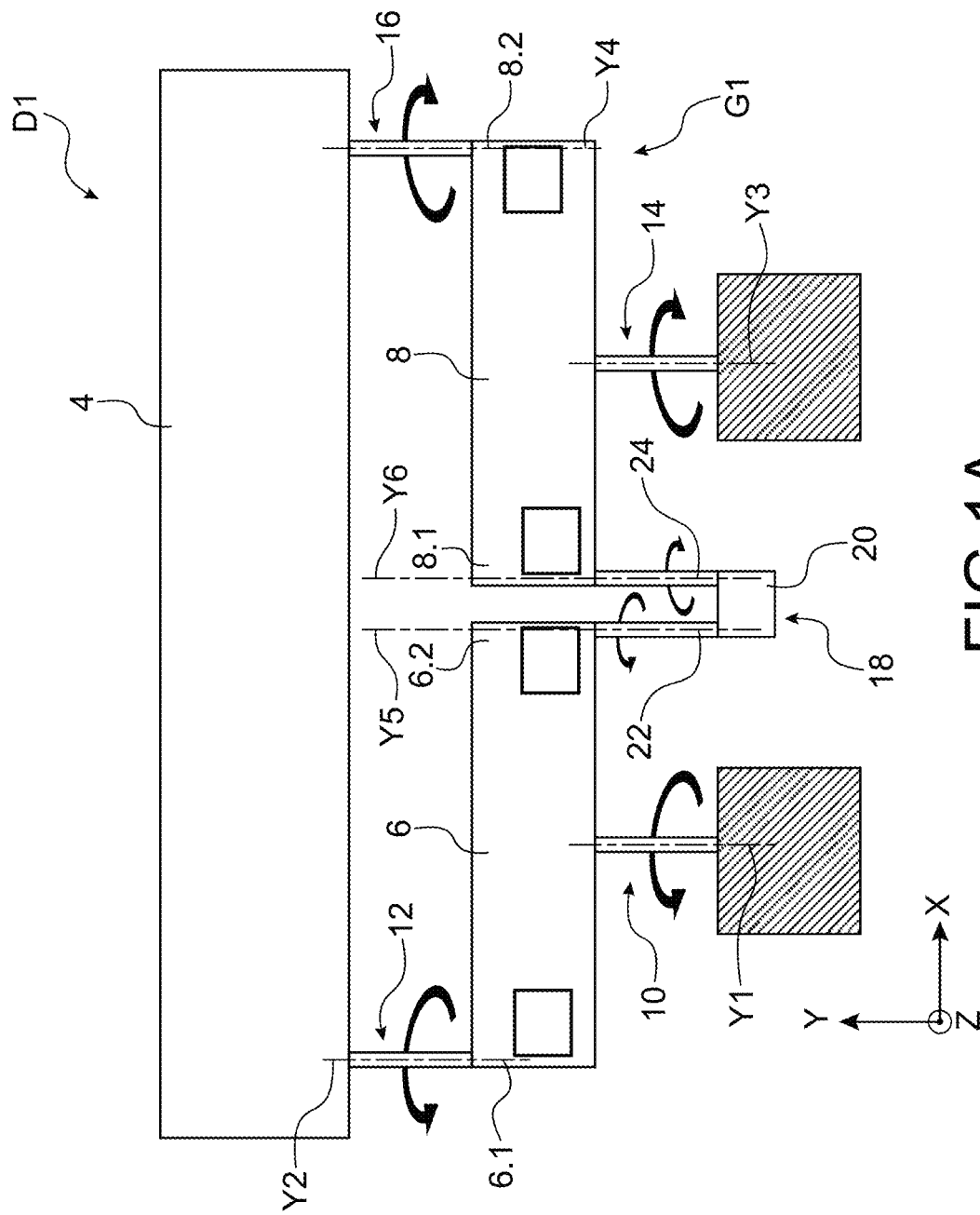
FIG. 1A is a representation of a device implementing translational guiding means according to a first exemplary embodiment, the moveable element being activated in the out-of-plane direction.

In the description that follows, the same references will be used for elements having the same functions and substantially the same shapes in the different exemplary embodiments.

The device comprise at least one system which can be a MEMS or a NEMS, or it can comprises several systems which can be several MEMS and/or several NEMS.

The devices described in the application may be implemented for example in a sensor, of inertial sensor type, the moveable element being an inertial mass, or in an actuator, the moveable element being able to be an optical element.

In FIGS. 1A to 1D may be seen a schematic representation of a device D1 according to a first exemplary embodiment.

The device D1 extends mainly in the plane XY. The device D1 comprises a support 2, an element intended to be displaced along the direction Z orthogonal to the plane XY. The element 4 is suspended with respect to the support so as to be able to be displaced with respect to said support. In this schematic representation, the support 2 is shown schematically by two anchoring pads.

The moveable element 4 is considered as rigid.

An element is designated as rigid in the present application when its deformations are negligible compared to the overall displacement in the out-of-plane direction.

The device D1 also comprises means G1 for translationally guiding the element 4 along the direction Z.

The means G1 comprise two rigid arms 6, 8. In this example, the two arms are aligned along the direction X. Each arm 6, 8 comprises two longitudinal ends 6.1, 6.2 and 8.1, 8.2 respectively. The ends 6.2 and 8.1 are arranged nearby and are designated "proximal ends", and the ends 6.1 and 8.2 are designated "distal ends". In this example, the faces of the proximal ends 6.2 and 8.1 are facing.

The arm 6 is mechanically connected to the support by a first pivot link 10 of axis Y1 and is mechanically connected to the element by a second pivot link 12 of axis Y2.

The arm 8 is mechanically connected to the support by a third pivot link 14 of axis Y3 and is mechanically connected to the element by a fourth pivot link 16 of axis Y4.

In the example represented, the first pivot link 10 is situated at the centre of the arm 6 and the second pivot articulation 12 is situated at the distal end 6.1. The third pivot articulation 14 is situated at the centre of the arm 8 and the fourth pivot link 16 is situated at the distal end 8.2.

Moreover, the means G1 comprise an articulation 18 between the two arms 6, 8, connecting the proximal ends 6.2 and 8.1.

The articulation 18 comprises a rigid part 20 and two pivot links 22, 24 of axis Y5, Y6, each pivot link 22, 24 connecting the rigid part 20 to a proximal end 6.2, 8.1 respectively.

The axes of the pivot articulations 10, 12, 14, 16, 22, 24 are parallel with each other.

At least two pivot articulations connected to each arm have a translational degree of freedom in the plane of the device along the arms. The pivot articulations advantageously comprise a beam capable of being torsionally deformed around the pivot axes. The beams offer a certain bending deformability.

In the example represented, all the pivot links 10, 12, 14, 16, 20, 22 are made by beams capable of being torsionally deformed around the pivot axis.

This translational degree of freedom may be conferred to all the pivot articulations. In the example represented and advantageously, the pivot links are made by beams capable of being torsionally deformed around the pivot axis.

The arms 6 and 8 are displaced in a plane P1 parallel to the plane XZ.

The operation of the guide means G1 will now be described in the case of an accelerometer, the element 4 forming for example an inertial mass.

When the sensor is subjected to an out-of-plane acceleration, i.e. along the direction Z, the inertial mass 2 is translationally displaced along the direction Z. The guiding means G1 move together with the inertial mass. The arms 6, 8 pivot around the links 12, 16 in opposite directions, as is shown schematically in FIG. 1A. The pivot links 10 and 14 are also activated in opposite directions, as well as the links 22, 24. The articulation 18 imposes a same out-of-plane displacement on the distal ends 6.1, 8.2, and thus imposes the arms to pivot in opposite directions.

Figure 1C:
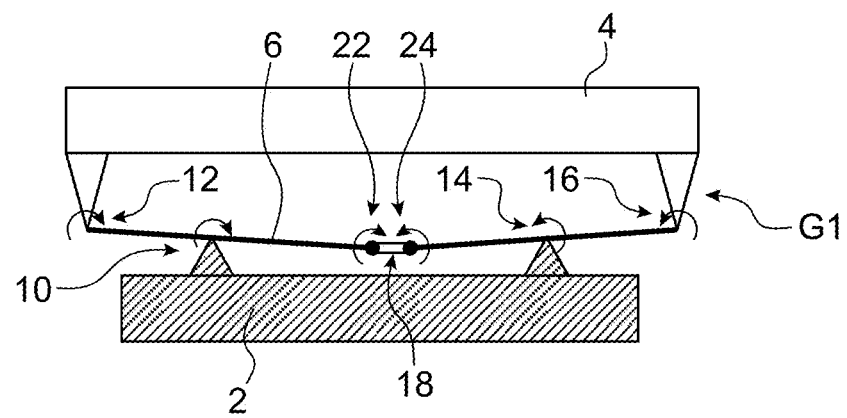
FIG. 1C is a schematic representation of the orientation of the different elements of the guiding means in the situation of FIG. 1A.
Figure 1D:
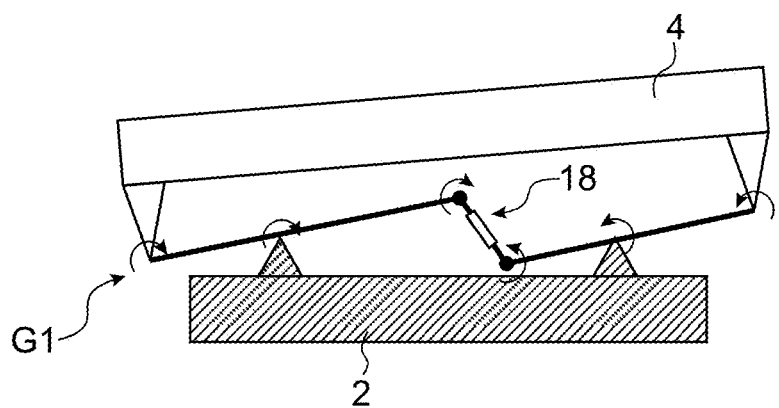
FIG. 1D is a schematic representation of the orientation of the different elements of the guiding means in the situation of FIG. 1B.

Furthermore, since the arms and their pivot links are symmetrical with each other, the distal ends are displaced by the same distance, imposing on the mass a displacement parallel to the support (FIG. 1C).

In the case of an acceleration in the plane, the directions of rotation at all the pivot links are the same as is represented in FIG. 1B, which tends to move the proximal ends 6.2 and 8.1 apart and to make the inertial mass tilt around an axis parallel to Y.

Yet, the implementation of the articulation 18 between the arms, and more generally the guiding means G1, increases the rigidity and reduces, or even prevents, such a tilting of the inertial mass, which limits the risks of a non-linearity in the measurement of the displacement of the mass and the risks of damage by contact. The effect of the articulation 18 is represented schematically in FIG. 1D. In this representation, the tilting of the mass is exaggerated for illustration purposes, but it will be understood that, thanks to the guiding means, a tilting of such amplitude is not allowed.

Preferably, the MEMS and/or NEMS device comprises several guiding means G1, and at least two guiding means of which the arms are displaced in orthogonal planes P1, P2 even further reducing displacements in the plane. Advantageously, it comprises three guiding means, the arms of two guiding means being displaced in parallel planes and the arms of the other guiding means being displaced in an orthogonal plane. Thus the rigidity in the plane offered by the guiding means is substantially improved.

The arms 6 and 8 may be of different dimensions and/or the pivot links could not be arranged in a symmetrical manner. But the choice of the dimensions and the emplacement of the pivot links are made such that the moveable element effectively has an out-of-plane displacement.

In exemplary embodiments, the device may comprise specific means for suspending the element, in effect the guiding means may not be able to ensure the suspension and/or to ensure a sufficiently rigid maintaining in the plane. Indeed, the torsion beams also have a certain bendability not being able to provide sufficient maintaining of the moveable element in the plane.

Figure 2:
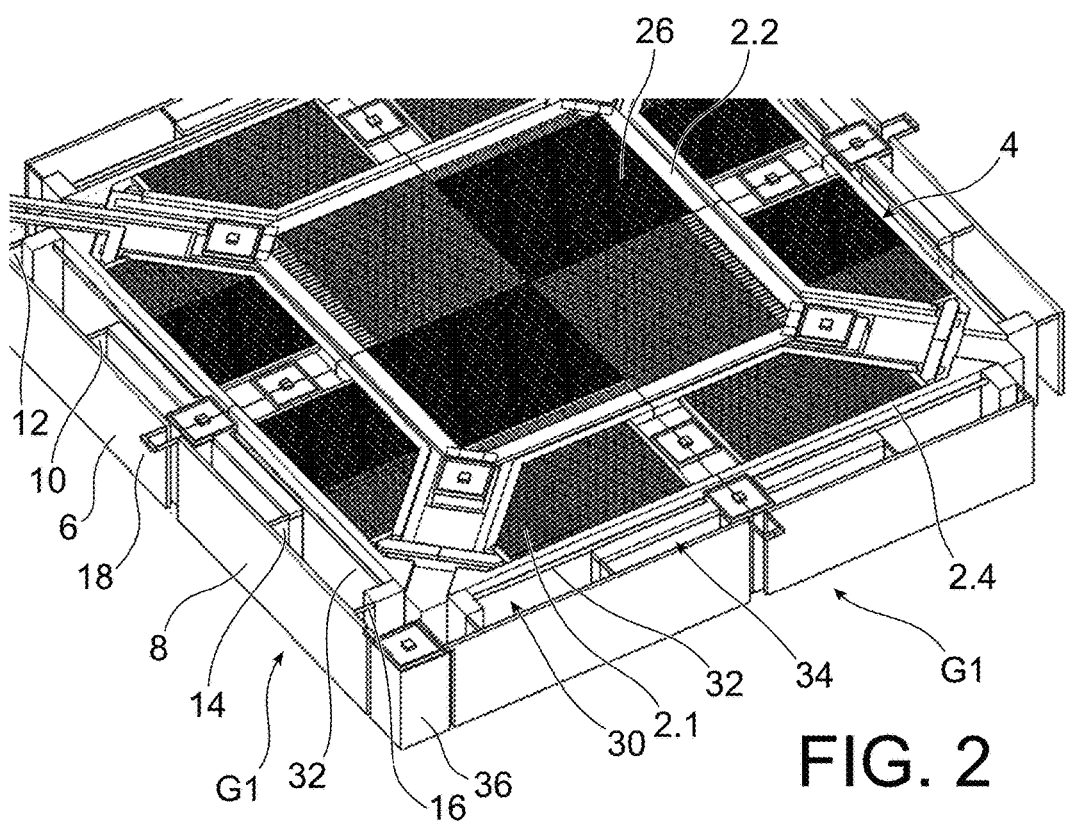
FIG. 2 is a representation in perspective of an inertial sensor implementing the guiding means of the device of FIG. 1A, FIGS. 3A and 3B are representations of the sensor of FIG. 2 in two different states.
Figure 3A:
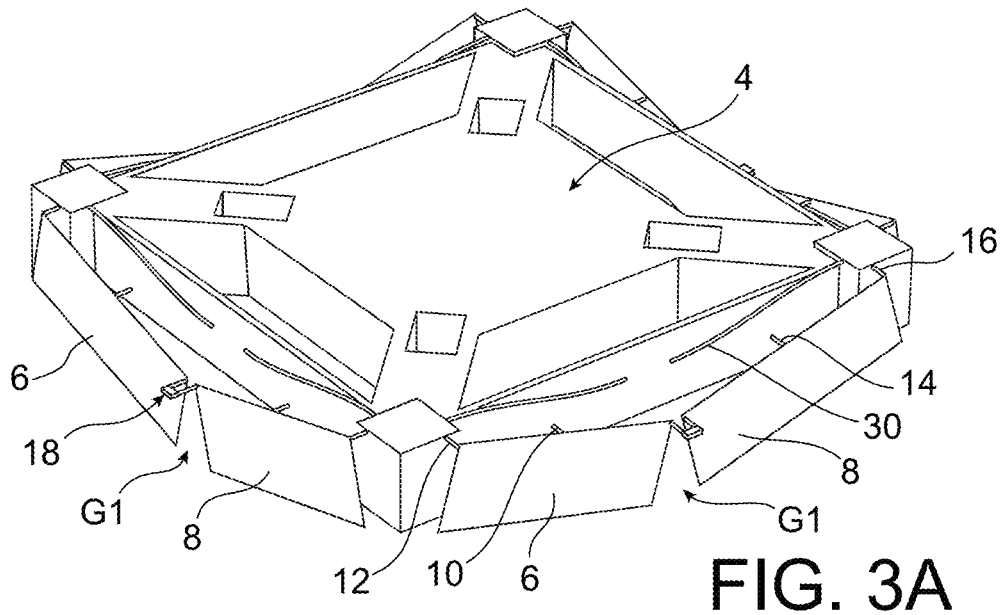
Figure 3B:
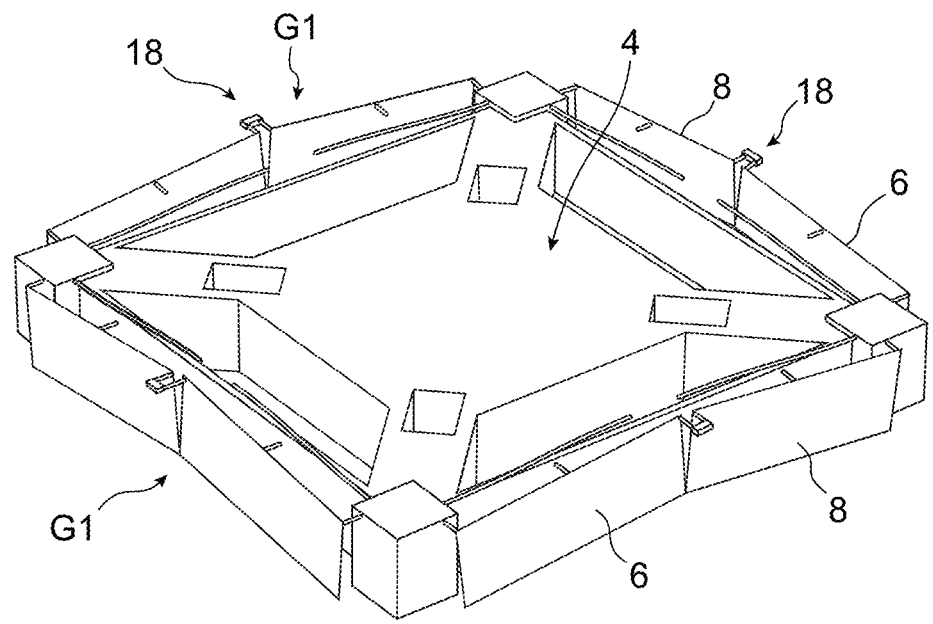

In FIGS. 2 and 3A and 3B may be seen partially represented an exemplary practical embodiment of a MEMS and/or NEMS device according to the first exemplary embodiment, comprising four guiding means. This device may be used as out-of-plane accelerometer.

This device makes it possible to carry out a differential measurement of the displacement of the mass.

The device comprises two detection assemblies so as to enable the differential measurement.

The device comprises a mass 4 including an outer frame 24 situated above a first part 2.1 of the support and a central part 26 situated below a second part 2.2 of the support.

The frame and the first part 2.1 comprise interdigitated electrodes forming first capacitors and the central part 26 and the second part 2.2 comprise interdigitated electrodes forming second capacitors. The out-of-plane displacement of the mass causes an opposite variation of the capacitances of the first and second capacitors, which enables the differential measurement.

The device also comprises means 30 for suspending the mass with respect to the support 2.

In this example, the suspension means 30 are eight in number, two on each side of the mass. They are each formed by a beam 32 extending parallel to an edge of said moveable element and anchored by one end to an anchoring pad 34 of the support and by another end to the mass. The beams 32 are capable of being flexionally deformed along an out-of-plane direction. The beams 32 are also flexionally deformable in the plane, but the fact of implementing eight beams 32 is equivalent to opposing displacement in the plane by the considerable compression/stretching stiffness of an orthogonal beam. These suspension means thus ensure a certain rigidity in the plane.

The device also comprises guiding means G1. Each of the guiding means extends along one side of the frame 26. The guiding means are similar to those of FIGS. 1A to 1D.

The distal ends 6.1, 8.2 of the arms 6, 8 of each of the guiding means are mechanically connected by a pivot link to the longitudinal ends of the edges of the frame of the mass. In the example represented, the support comprises four anchoring pads 36 situated facing four summits of the mass and intended to cooperate with the arms 6, 8 to form abutments as will be described in greater detail hereafter.

In this practical example, the arms 6, 8 are formed by strips having a large width in the direction Z and thus offering great rigidity in this direction.

Moreover, in the example represented, the pivot links and the articulation 18 are situated in an upper part of the arms 6, 8. It will be understood that the pivot links and the articulation 18 may be situated in intermediate zones and/or in a lower part of the arms and/or in the upper part.

The guiding means thus ensure the guiding of the mass at its four summits.

The suspension means 30 limit, or even avoid, movements in the plane. The combination of the suspension means and the guiding means makes it possible to produce a device of which the management of the behaviour of the mass is improved.

In FIGS. 3A and 3B may be seen the device of FIG. 2 in two different states. In FIG. 3A, the mass is in low position and in FIG. 3B, the mass is in high position.

In the example of FIG. 2, the moveable element is of square shape and comprises four guiding means.

It may be envisaged that the moveable element is for example triangular and comprises three guiding means. In this case, the planes of the different guiding means are secant without being orthogonal.

Figure 4:
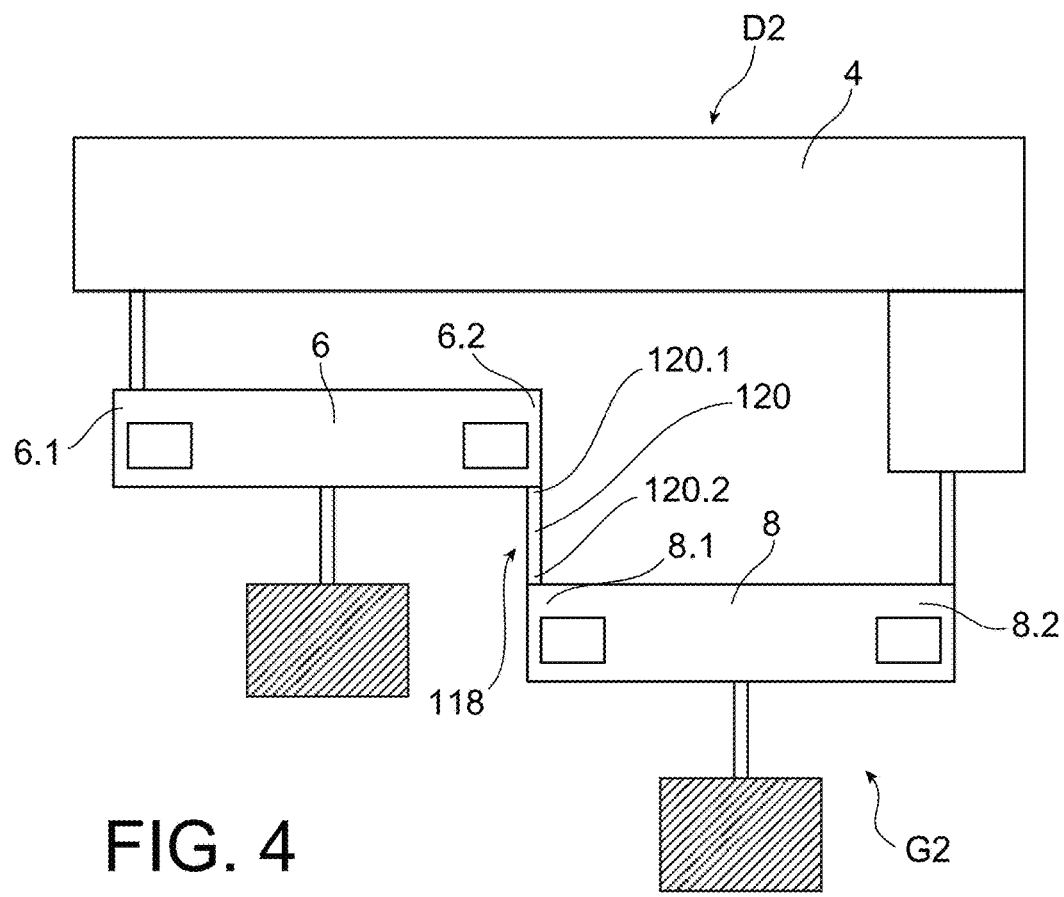
FIG. 4 is a representation of a device implementing translational guiding means according to a second exemplary embodiment.
Figure 5:
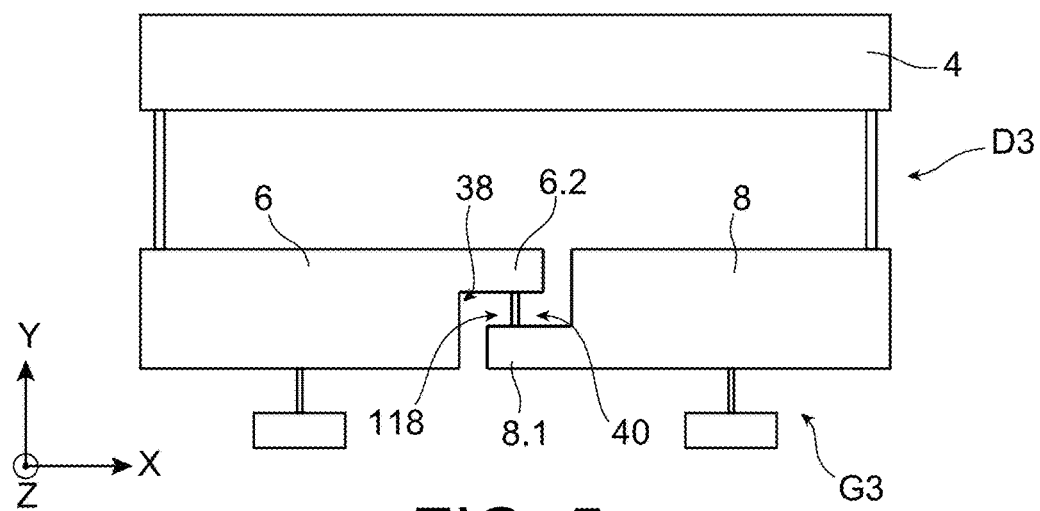
FIG. 5 is a representation of a device implementing translational guiding means according to an alternative of the second exemplary embodiment.

In FIGS. 4 and 5 may be seen a device according a second exemplary embodiment.

The device D2 differs from the device D1 notably in that the guiding means G2 differ from the guiding means G1 by the articulation 118 between the arms 6, 8.

In FIG. 4, the arms 6 and 8 are arranged in two parallel planes. Thus the faces of the proximal ends 6.2, 8.1 are no longer facing but substantially in a same plane R perpendicular to the plane of the arms 6, 8.

The articulation 118 comprises a single beam or torsion bar 120 extending in the plane R, of which one longitudinal end 120.1 is mechanically connected to a side of the beam 6 and another end 120.2 is mechanically connected to a side of the facing beam 8. The implementation of a torsion beam offers increased rigidity.

In FIG. 5 may be seen an advantageous alternative device D3 of the device D2. In the device D3, the beams 6, 8 of the guiding means G3 are such that they offer a reduced size compared to the structure of D2. To do so, the proximal ends 6.2, 8.1 of the beams comprise a cut 38, 40 respectively enabling the beams to be brought closer together.

Figure 6A:
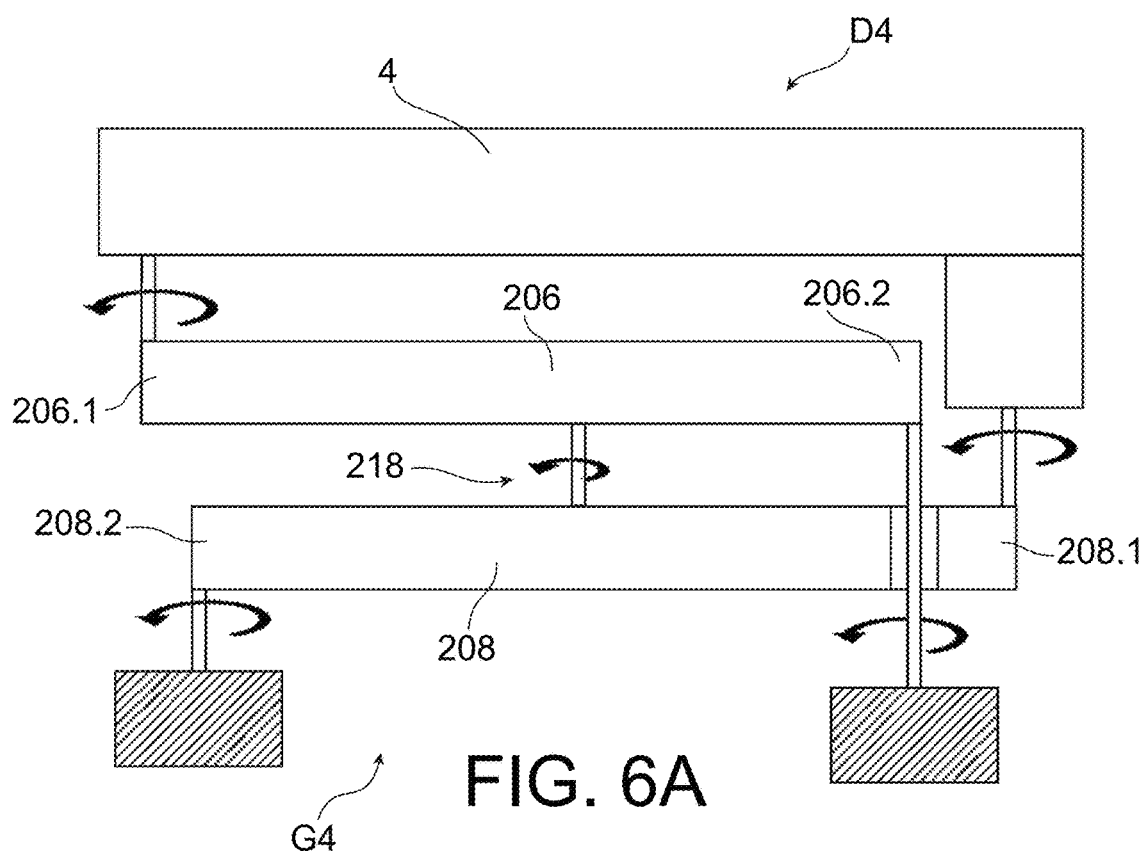
FIG. 6A is a representation of a device implementing translational guiding means according to a third exemplary embodiment.

In FIG. 6A may be seen another device D4 according to another exemplary embodiment.

In the device D4, the arrangements of the pivot links are modified with respect to those of the devices D1 to D3.

In the device D4, the guiding means G4 comprise two arms 206, 208 arranged in two parallel planes and an articulation 218 between the arms 206, 208.

A lateral face of the arm 206 is facing a lateral face of the arm 208 and the articulation 218 extends between the two lateral faces. The coupling articulation 2018 is formed by a single torsion bar.

Advantageously, the articulation is formed by a torsionally deformable beam.

The pivot link between the beam 206 and the moveable element is situated at a longitudinal end 206.1 of the beam 206, and the pivot link between the beam 206 and the support is situated at the other longitudinal end 206.2 of the beam 206.

The pivot link between the beam 208 and the moveable element is situated at a longitudinal end 208.1 of the beam 208 and the pivot link between the beam 208 and the support is situated at the other longitudinal end 208.2 of the beam 208.

The pivot links are advantageously made by torsionally deformable beams.

In the example represented, the pivot link between the end 206.2 of the beam 206 and the support crosses the beam 208, it is situated in a plane arranged between the support and the beam 208 in order not to hinder the displacement of the beam 208.

In this exemplary embodiment, the arms have an increased length compared to the arms of the devices D1 to D3. The result is that for a same out-of-plane displacement of the moveable element, the angular displacement of the arms is reduced. On the one hand, it is then possible to implement at least one more rigid articulation 218, making the device more rigid. On the other hand, the stiffness of the torsion bar faced with a desired movement is reduced and makes it possible to obtain lower resonance frequencies, thus more displacement, thus more signal for a same acceleration.

Figure 6B:
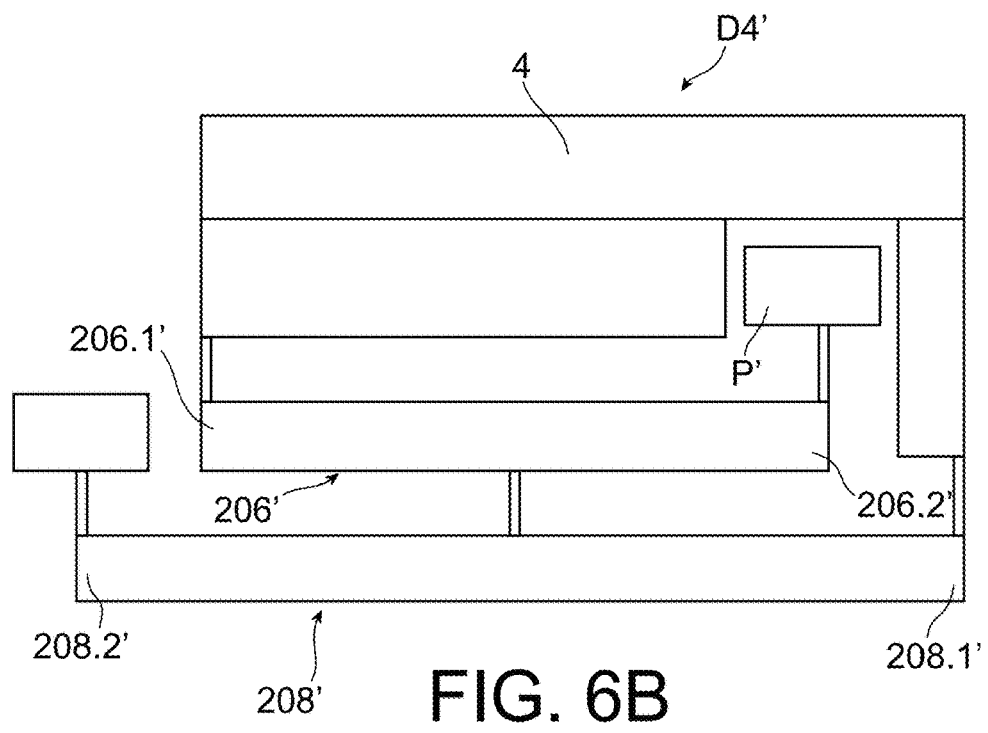
FIG. 6B is a representation of an alternative of the device of FIG. 6A.

In FIG. 6B may be seen a device D4' according to an alternative embodiment of the device D4.

The guiding means comprise two arms 206', 208' arranged in two parallel planes and articulated with respect to each other by an articulation 218'.

A lateral face of the arm 206' is facing a lateral face of the arm 208' and the articulation 218' extends between the two lateral faces, more particularly a torsion bar extends between the two lateral faces.

The arm 208' situated the outermost with respect to the moveable element 4 has a length greater than that of the arm 206'.

Advantageously, the articulation is formed by a torsionally deformable beam.

The pivot link between the beam 206' and the moveable element is situated at a longitudinal end 206.1' of the beam 206', and the pivot link between the beam 206' and the support is situated at the other longitudinal end 206.2' of the beam 206'.

The pivot link between the beam 208' and the moveable element 4 is situated at a longitudinal end 208.1' of the beam 208' and the pivot link between the beam 208' and the support is situated at the other longitudinal end 208.2' of the beam 208'.

The arm 208' situated the outermost with respect to the moveable element 4 has a length greater than that of the arm 206', such that the pivot articulations between the arm 208' and the support and between the arm 208' and the moveable element are outside of the arm 206' and its pivot articulations. Thus, unlike the device D4, there is no superimposition between one or more pivot articulations and the arms.

The pivot links are advantageously made by torsionally deformable beams.

In the example represented, the moveable element is structured to arrange an emplacement for an anchoring pad P', which makes it possible to reduce the size. It could be provided that the moveable element is not structured and that the anchoring pad is in front of the moveable element in the example represented.

Figure 7A:
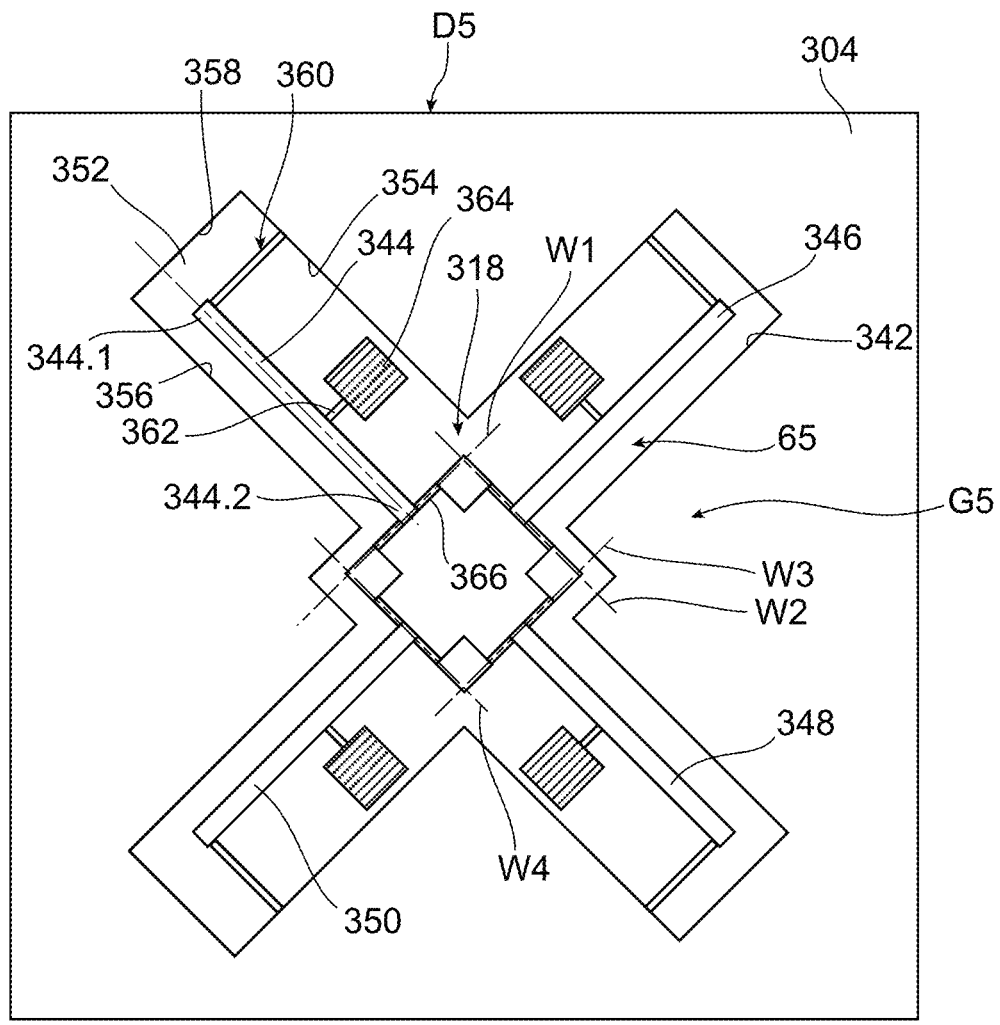
FIG. 7A is a representation of a device implementing translational guiding means according to a fourth exemplary embodiment.
Figure 7B:
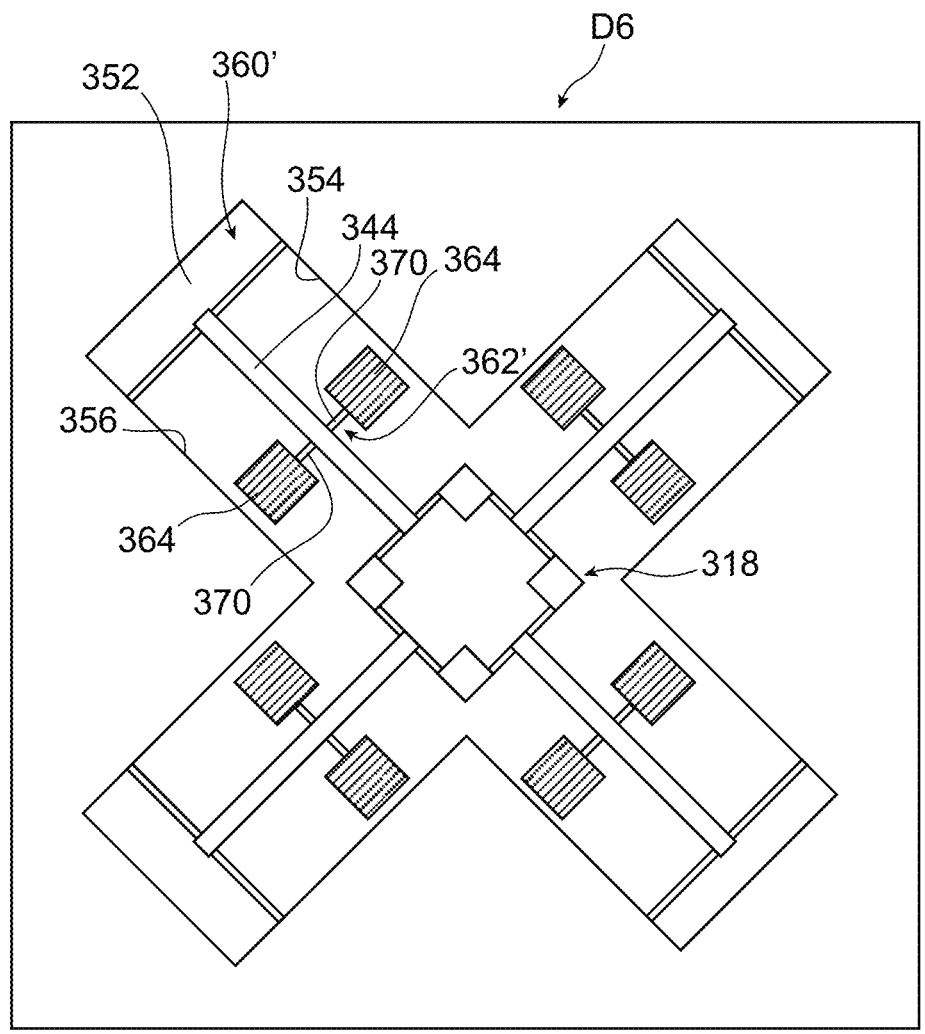
FIG. 7B is a representation of an alternative of the device of FIG. 7A.
Figure 8:
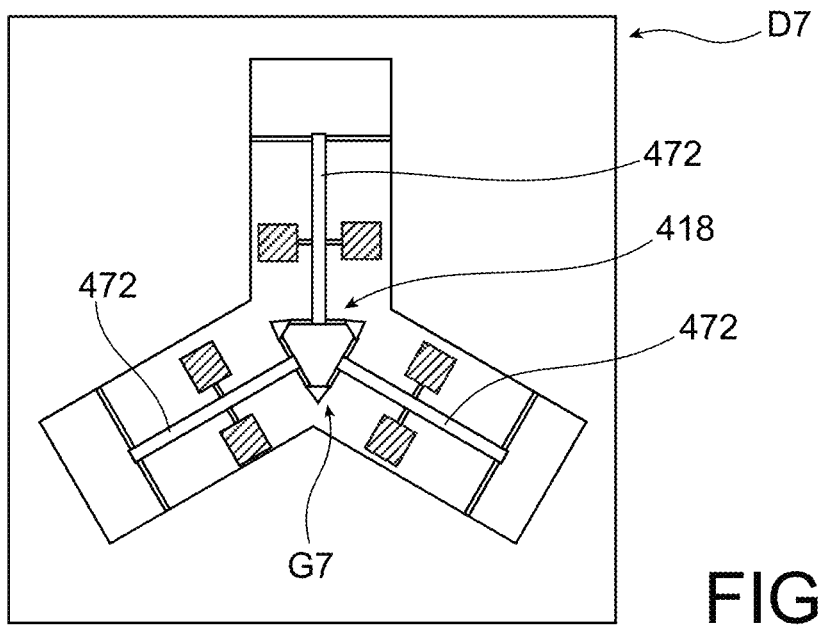
FIG. 8 is a representation of a device implementing translational guiding means according to another exemplary embodiment.

In FIGS. 7A, 7B and 8 may be seen a device according to another exemplary embodiment wherein the coupling means are situated inside the perimeter of the moveable element.

In FIG. 7A, the device D5 comprises a moveable element 304 provided with a window traversing the moveable element 304 in the direction Z, produced for example by etching and guiding means G5 arranged in the window 342.

The guiding means G5 comprise four rigid arms 344, 346, 348, 350 rotationally articulated on the one hand on the moveable element, on the other hand on the support and finally on a coupling articulation 318. The axes of the pivot articulations of each shaft are parallel with each other.

In the example represented, the window 342 has a cross shape of which the branches extend along diagonals of the moveable element of rectangular shape.

The arms are arranged with respect to each other so as to form a cross corresponding to the window 342.

The four arms are connected to the moveable element, to the support and to the coupling articulation in a similar manner, only the links of the arm 344 will be described in detail.

The arm 344 is arranged in a branch 352 of the window 342.

The branch 352 comprises two lateral edges 354, 356 connected by a longitudinal edge 358 situated opposite the centre of the window.

The arm 344 is connected to the moveable element 354 by a pivot link 360 between the lateral edge 354 and a distal end 344.1 of the arm.

The arm is connected to the support 302 by a pivot link 362 extending between a central zone of the arm and an anchoring pad 364 situated between the lateral edge 354 and the arm 344. In an alternative, the anchoring pad may be situated between the arm 354 and the other lateral edge 356. The arm 344 is connected to the coupling articulation 318 by its proximal end 344.2. In the example represented, the coupling articulation 318 comprises a frame formed of four beams 366 connected together by rigid connectors 370.

The beams are capable of being torsionally deformed. The proximal end 344.1 of the arm 344 is fixed to one of the beams 366, such that the axis of the arm 344 and the axis W1 of the beam 366 are orthogonal. Thus the link between the arm 344 and the coupling articulation is a pivot link of axis W1.

The pivot links 360 and 362 are formed by torsionally deformable beams.

The other arms 344, 346, 348 and 350 are rotationally articulated on the coupling articulation around the axis W1, W2, W3, W4, the axes W1 and W3 being parallel and perpendicular to the axes W2 and W4 parallel with each other.

The out-of-plane displacement of the moveable element is allowed by the pivot links and the transversal deformation of the coupling articulation, the beams 366 offering a certain bending deformability.

In an alternative, the emplacement of the pivot links 360 and 362 could be inverted, and/or be situated at other longitudinal positions of the arm 344.

In FIG. 7B may be seen an alternative embodiment D6 of the device D5. The pivot link 360' of the device D6 between the arm 344 and the moveable element is formed by a beam extending between the two lateral edges 354, 356 of the branch of the window. The pivot link 362' of the device D6 between the arm 344 and the support comprises two beams 370 extending on either side of the axis of the arm 344 and each anchored on an anchoring pad. The device D6 offers the advantage compared to D5 of a better holding of the mass. Stresses are moreover balanced out.

In an alternative, it may be envisaged that one of the pivot links 354, 356 is that of the device D5 and the other of the pivot links 356, 354 is that of the device D6.

In FIG. 8 may be seen another exemplary embodiment D7, wherein the guiding means G7 comprise three arms 472 articulated on the moveable element and on the support in a manner similar to that described for the devices D5 and D6. The arms are coupled to each other by a coupling articulation 418 formed by a triangular frame including three torsionally deformable beams and forming the pivot links between the arms and the coupling articulation.

The axes of the pivot links between the one hand the arm and the moveable element, on the other hand the arm and the support and finally between the arm and the coupling articulation are parallel with each other.

The device D7 has the advantage compared to the devices D5 and D6 of having a smaller reduction in mass by only implementing three arms and of having a lower resonance frequency, while ensuring the maintaining in two directions.

According to another exemplary embodiment, the means for guiding the devices D5 to D7 may only comprise two arms connected by a coupling articulation and arranged in a window traversing the moveable element.

Figure 9A:
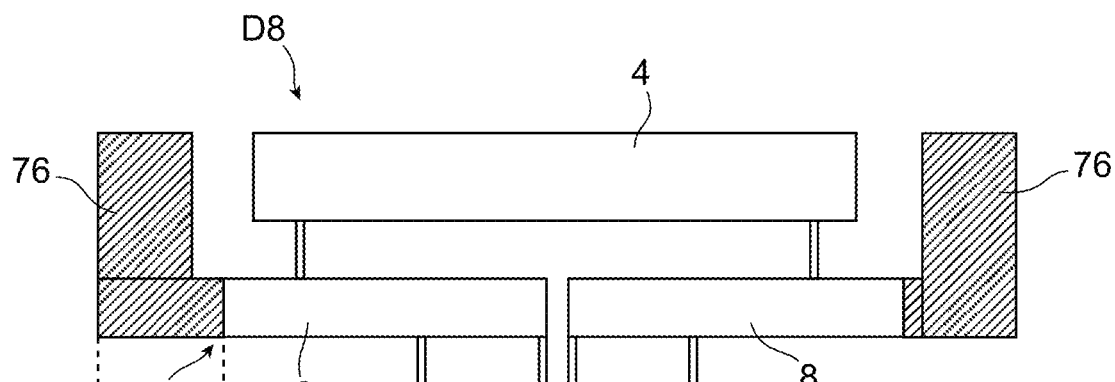
FIG. 9A is a top view of a device implementing translational guiding means according to the first exemplary embodiment and further comprising out-of-plane abutment means.
Figure 9B:
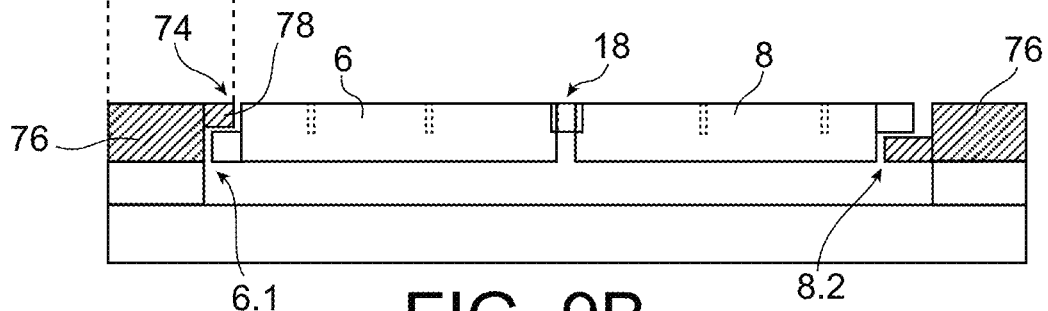
FIG. 9B is a side view of the device of FIG. 9A.
Figure 9C:
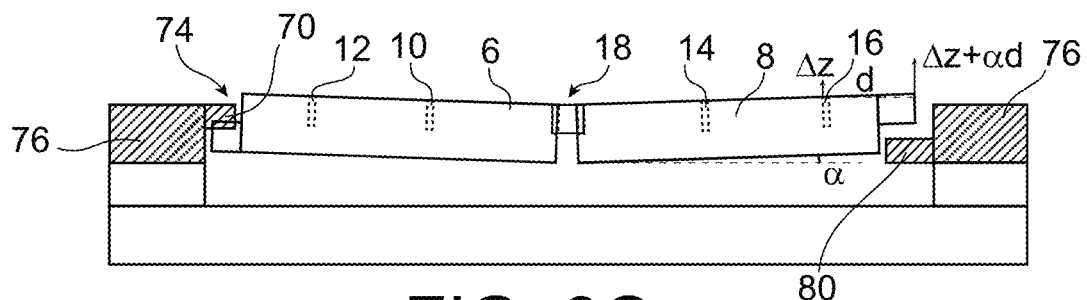
FIG. 9C represents, in side view, the device of FIGS. 9A and 9B, in an abutment state.

In FIGS. 9A to 9C may be seen an advantageous example of a device D8.

The device D8 has a structure similar to that of the device D1 and comprises in addition out-of-plane abutment means 74

The out-of-plane abutment means are borne both by the guiding means and the support.

The support comprises uprights 76 situated on the lateral edges of the guiding means on either side of the coupling articulation.

In the example represented and advantageously, the out-of-plane abutment means are bidirectional. But it will be understood that the abutment means could form an abutment only in one out-of-plane displacement direction.

The pivot articulations between the arms and the moveable element are arranged in such a way that the distal ends 6.1 and 8.2 are projecting with respect to these pivot articulations in the direction X.

One of the uprights 76 comprises a lateral projection 78 extending above the distal end 6.1 of the arm 6 in considering the direction Z. Advantageously, the distal end 6.1 is structured which makes it possible to bring the structures closer together and to reduce the size along the direction Z.

The other upright 76 comprises a lateral projection 80 extending below the distal end 8.2 of the arm 8 in considering the direction Z. Advantageously, the distal end 8.2 is structured.

In FIG. 9C may be seen the distal end 6.1 of the arm 6 in abutment against the lateral projection 78 of the upright 76.

In this example and advantageously, the abutment means intervene before the mass enters into contact with the electrodes intended for the detection of the displacement. Indeed, as is shown schematically in FIG. 9C, if the moveable element is displaced by a distance $\Delta z$ along the direction Z in moving away from the support, then the distance between the pivot link between the arm and the moveable element and the abutment is d and that the pivoting angle of the arms is $\alpha$, then the distal end 6.1 is displaced by $\Delta z + \alpha d$.

Advantageously, the distal ends 6.1, 8.2 capable of coming into contact with the uprights 76 have a small surface, which reduces the risks of sticking.

In other exemplary embodiments, it may be envisaged that the two abutments are borne by the same arm, for example by structuring the arm.

Figure 7C:
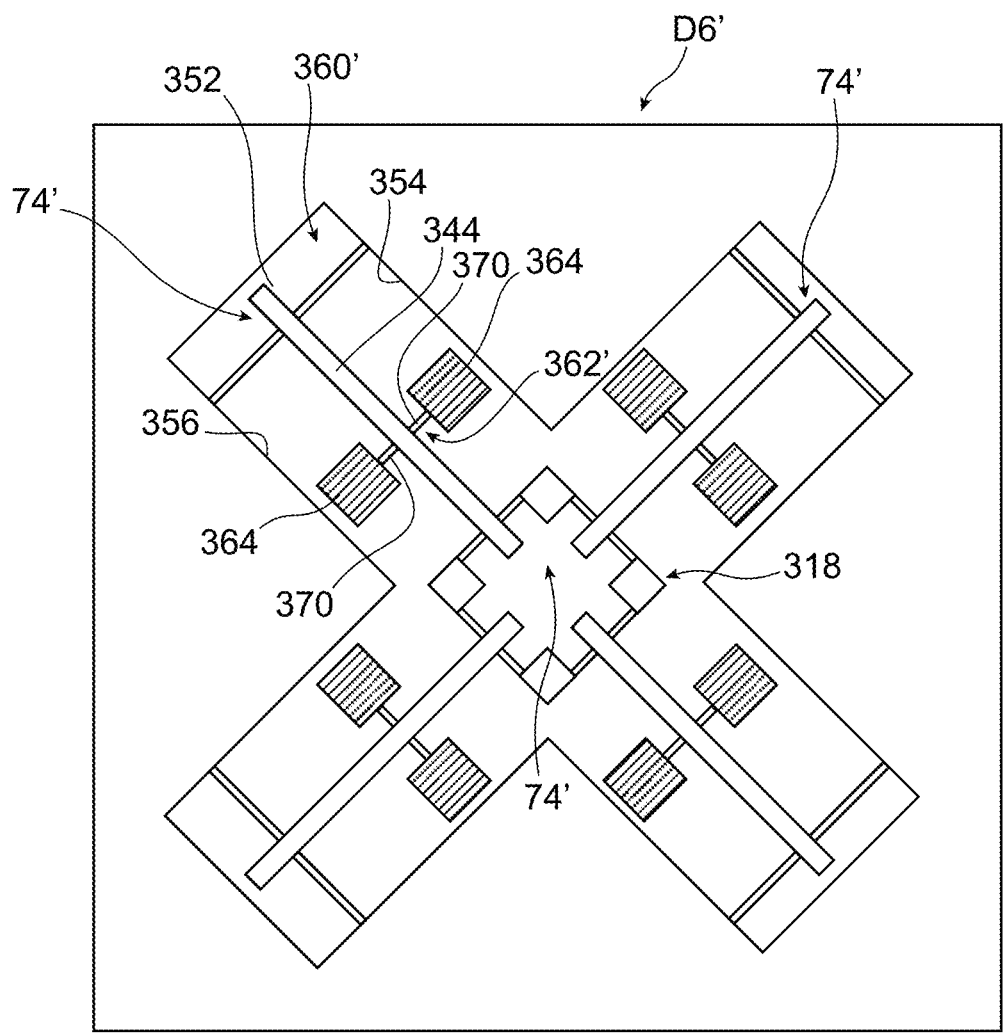
FIG. 7C is a representation of the device of FIG. 7B comprising out-of-plane abutment means.

In FIG. 7C may be seen an alternative embodiment D6' of the device D6 comprising abutment means 74' formed by the longitudinal ends of the arms which are such that the axes of the pivot articulations 360', 362' are not situated at the ends but at intermediate positions of the arms. One or the other of the longitudinal ends of each arm abuts against the support following the displacement of the moveable part.

It will be understood that the out-of-plane abutment means may apply to all the devices D2 to D7 described above.

In the example of FIGS. 2 and 3A and 3B, the out-of-plane guiding means G1 are situated on the outside of the structure. In an alternative, it may be envisaged to invert the suspension means and the guiding means, by arranging the guiding means between the moveable element and the anchoring pad 34, and by arranging the suspension means on the outside.

The guiding means of FIGS. 1 to 6 could comprise more than two arms, for example four arms articulated one to the other, on the moveable element and on the support.

Moreover, in the case of a device comprising several guiding means, said means could have different structures.

An example of method for producing the device D8 comprising out-of-plane abutment means will now be described, by means of FIGS. 10A to 10G.

The production method implements two mechanical layers.

Figure 10A:
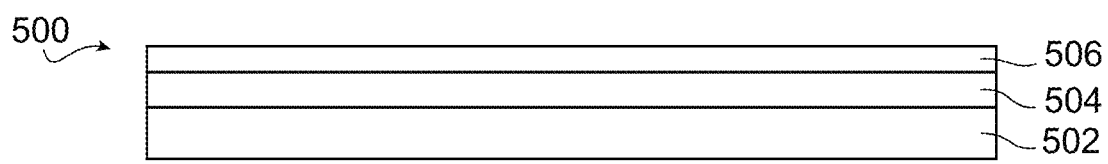
FIGS. 10A to 10G are schematic representations of different steps of an example of method for producing guiding means of the application.
Figure 10B:
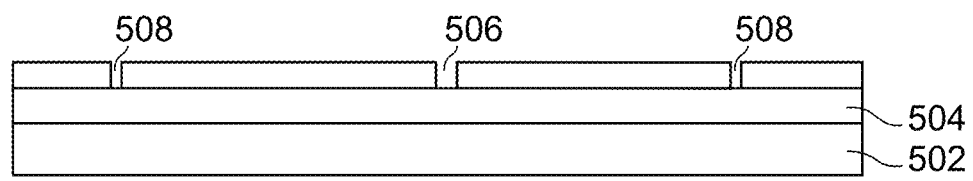

In this example, an SOI (silicon on insulator) substrate 500 is used, for example of 750 µm thickness, comprising a silicon support 502, a $SiO_2$ layer 504 and a silicon layer 506, the oxide layer has for example a thickness of 2 µm. This substrate is represented in FIG. 10A.

During a first step, three trenches 508 are produced by etching of the layer 506 with stoppage on the oxide layer

504, for example by DRIE (deep reactive ion etching), making it possible to delimit the guiding means, in particular the arms 6, 8.

The element thereby obtained is represented in FIG. 1013.

During a following step, the trenches 508 are filled for example with oxide 510. The oxidation may be formed by thermal oxidation, which has the effect of partially filling the trenches and/or by deposition of oxide over the entire surface of the substrate to cover the trenches. The oxide layer 510 covers the entire front face of the substrate. This step could be followed by a chemical mechanical polishing.

Figure 10C:
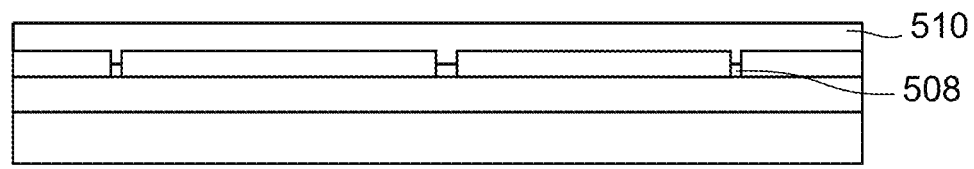

The element thereby obtained is represented in FIG. 10C.

During a following step, the oxide layer 510 is structured so as to form islands 511 that will serve to produce pivot links and abutments. The structuring may be carried out by RIE (reactive ion etching).

Figure 10D:
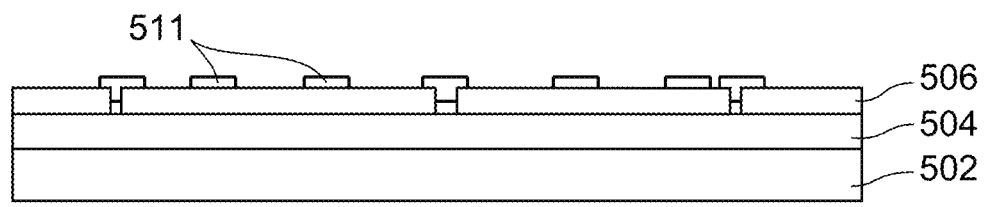

The element thereby obtained is represented in FIG. 10D.

During a following step, a thick silicon layer 512, for example of thickness comprised between several μm and several tens of μm, is formed on the structured oxide layer, for example by epitaxial growth. Silicon is formed between the islands and on the islands. In an alternative, a conductive material different to that of the substrate could form the layer 512.

A chemical mechanical polishing may next take place.

Figure 10E:
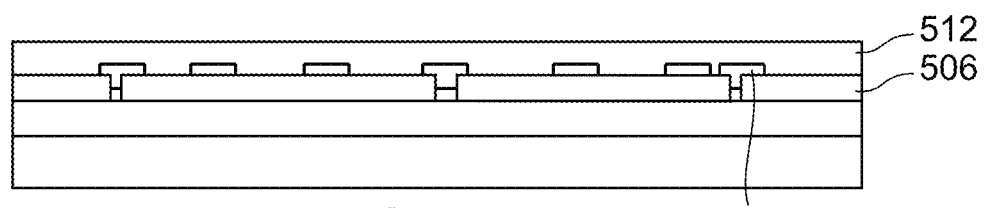

The element thereby obtained is represented in FIG. 10E.

During a following step, the layer 512 is structured in order to limit at least partially the arms and the pivot links and the moveable element, advantageously by DRIE. In this example, the moveable element and the guiding means are made of one piece. In another example, the guiding means may be produced in the layer 506, in this case the moveable element and the guiding means are not one piece.

Figure 10F:
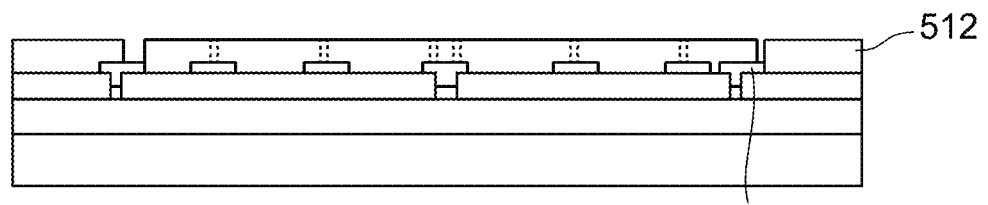

The element thereby obtained is represented in FIG. 10F.

During a following step, the guiding means are released by removing the islands and in part the sacrificial layer 504, for example using vapour phase hydrofluoric acid.

It follows from this exemplary method that the arms comprise two silicon layers formed during two different steps.

Figure 10G:
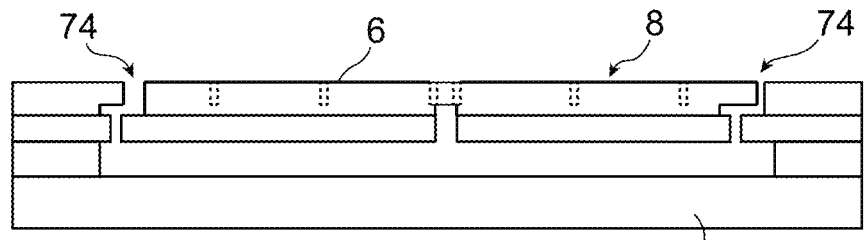

The element thereby obtained is represented in FIG. 10G.

This exemplary method is particularly suited for the production of the device D4 comprising a beam forming pivot link extending in a plane situated under the arm 8.

Figure 11A:
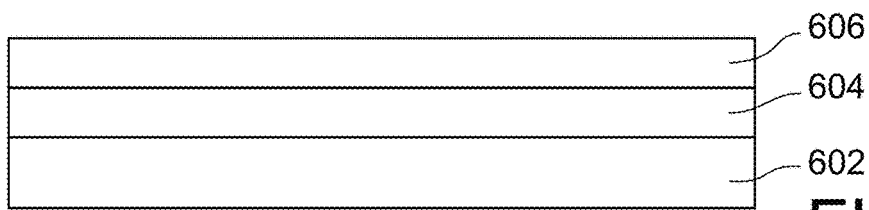
FIGS. 11A to 11C are schematic representations of different steps of an example of method for producing guiding means of the application.
Figure 11B:
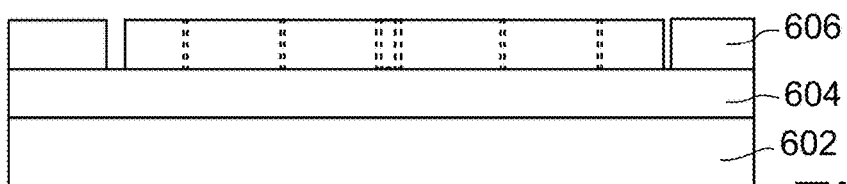
Figure 11C:
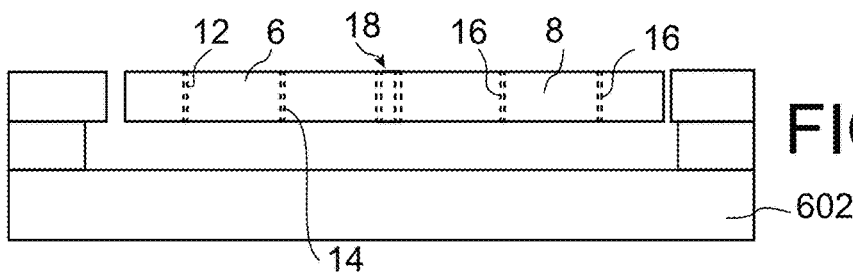
Figure 12:
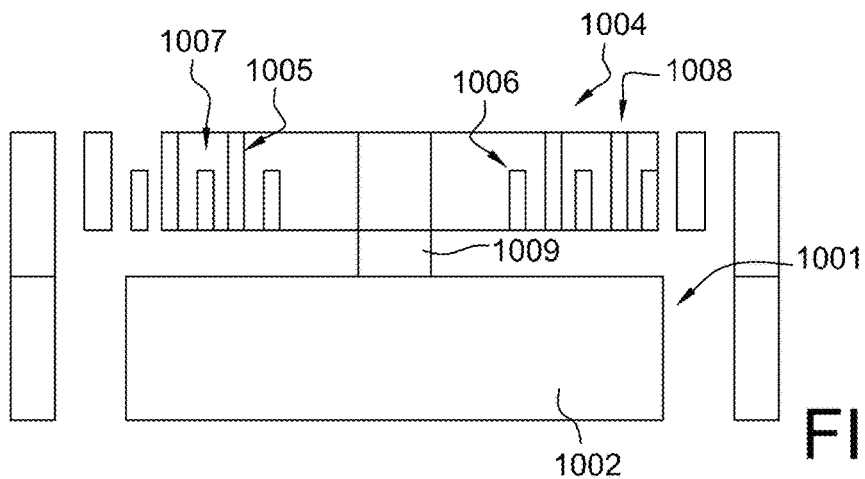
FIG. 12 is a side view of an accelerometer with out-of-plane displacement of the prior art.

In FIGS. 11A to 11C may be seen another example of method only implementing one mechanical layer. In this example, the device D1 is produced.

In this example, a substrate comprising a silicon support 602 and a SiO$_2$ layer 604 is used.

During a first step, a silicon layer 606 is formed on the oxide layer 604 intended to form a sacrificial layer, the layer 606 is formed for example by deposition of polysilicon by physical vapour deposition (PVD) or by transfer.

The element thereby obtained is represented in FIG. 11A.

During a following step, the layer 606 is structured with a view to forming the arms and pivot articulations. The pivot articulations are represented in dotted lines. The structuring is for example obtained by deep etching.

The element thereby obtained is represented in FIG. 11B.

During a following step, the guiding means are released, by eliminating a part of the sacrificial layer 604, for example by using vapour phase hydrofluoric acid.

The element thereby obtained is represented in FIG. 11C.

For example the device D4' may be produced by the methods of FIGS. 11A to 11C.

The guiding means of the present application are particularly suited to implementation in an inertial sensor with out-of-plane displacement such as that represented in FIG. 2. They limit non-linearities in the displacement measurements and the risks of contact between the interdigitated electrodes.

It will be understood that such means apply to other types of inertial sensor implementing other detection means, for example piezoresistive means. They also apply to actuators with out-of-plane displacement and to any other device comprising at least one moveable element and requiring a guiding along the out-of-plane direction.

The invention claimed is:

1. Device comprising at least one system among a MEMS and a NEMS and also comprising a support and at least one moveable element so as to be able to be translationally displaced with respect to the support in an out-of-plane direction with respect to a plane of the device, at least one guiding means for translationally guiding said element, said guiding means comprising at least two rigid arms extending longitudinally, a pivot articulation between each arm and the moveable element and a pivot articulation between each arm and the support, the guiding means also comprising a coupling articulation between the two arms comprising at least one pivot articulation, at least two pivot articulations connected to each of the arms having a translational degree of freedom in the plane of the device along the arms, said pivot articulations having axes of rotation at least parallel with each other such that, during a translational displacement of the moveable element, the arms pivot with respect to each other in opposite directions, wherein the coupling articulation is arranged between planes containing the pivot articulations between the arms and the support, said planes being parallel to the out-of-plane direction.

2. Device according to claim 1, wherein the pivot articulations having a translational degree of freedom in the plane of the device along the arms comprise at least one torsionally deformable beam.

3. Device according to claim 1, wherein the coupling articulation comprises two torsionally deformable beams and a rigid element connecting the two beams, the two beams being furthermore each fixed to an arm.

4. Device according to claim 1, wherein the coupling articulation comprises a single torsionally deformable beam fixed to the two arms, said beam being perpendicular to the longitudinal axes of the arms.

5. Device according to claim 4, wherein the two arms are in two distinct parallel planes, each arm being connected to the moveable element by one of its longitudinal ends, to the support by the other of its longitudinal ends and the beam of the coupling articulation extending between the two arms in intermediate zones of the arms between their longitudinal ends.

6. Device according to claim 1, wherein the guiding means is arranged along at least one outer edge of the moveable element.

7. Device according to claim 1, comprising at least two guiding means.

8. Device according to claim 7, wherein axes of rotation of the two guiding means are secant to each other.

9. Device according to claim 1, wherein the guiding means comprises at least three arms and the coupling articulation comprises at least three torsionally deformable beams connected to each other so as to form a closed shape, each arm being fixed to a beam of the coupling articulation such that the longitudinal axis of the arm is perpendicular to the axis of the beam.

10. Device according to claim 9, wherein the guiding means is arranged in a window formed through the moveable element such that it is included in a perimeter of the moveable element.

11. Device according to claim 9, wherein the at least three arms are arranged with respect to each other such that the coupling articulation is arranged substantially at a center of a cross.

12. Device according to claim 1, comprising at least one out-of-plane abutment, said at least one out-of-plane abutment being formed between the support and at least one arm of at least one guiding means.

13. Device according to claim 12, wherein said at least one out-of-plane abutment is such that at least one first abutment is formed in a first out-of-plane displacement direction, the first abutment being supported one of the arms in cooperation with the support.

14. Device according to claim 13, wherein the first out-of-plane abutment is formed at a longitudinal end of the arm, and wherein the pivot articulation between the arm and the moveable element is situated between said longitudinal end of the arm and the coupling articulation, except for said longitudinal end.

15. Device according to claim 14, wherein the at least on out-of-plane abutment is such that it also form a second abutment in a second out-of-plane displacement direction.

16. Device according to claim 1, comprising at least one suspension element for suspending said moveable element from the support distinct from the at least one guiding means.

17. Inertial sensor comprising at least device according to claim 1, the moveable element forming an inertial mass, and a detector for detecting out-of-plane displacement of the inertial mass.

18. Inertial sensor according to claim 17, wherein the detector comprises a surface variation capacitive detector which comprises interdigitated electrodes, one part being borne by the inertial mass and an other part being borne by the support situated above the inertial mass.

* * * * *